(12) United States Patent
Zhang

(10) Patent No.: US 11,011,591 B2
(45) Date of Patent: May 18, 2021

(54) ORGANIC LIGHT EMITTING DIODE DISPLAY PANEL AND METHOD FOR FABRICATING SAME

(71) Applicant: WUHAN CHINA STAR OPTOELECTRONICS SEMICONDUCTOR DISPLAY TECHNOLOGY CO., LTD., Hubei (CN)

(72) Inventor: Xingyong Zhang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 16/607,368

(22) PCT Filed: Aug. 7, 2019

(86) PCT No.: PCT/CN2019/099574
§ 371 (c)(1),
(2) Date: Oct. 23, 2019

(87) PCT Pub. No.: WO2020/237829
PCT Pub. Date: Dec. 3, 2020

(65) Prior Publication Data
US 2020/0381497 A1    Dec. 3, 2020

(30) Foreign Application Priority Data

May 28, 2019    (CN) .......................... 201910451474.0

(51) Int. Cl.
*H01L 27/32*    (2006.01)

(52) U.S. Cl.
CPC ...... *H01L 27/3246* (2013.01); *H01L 27/3272* (2013.01); *H01L 2227/323* (2013.01)

(58) Field of Classification Search
CPC ............. H01L 27/3246; H01L 27/3276; H01L 2227/323
(Continued)

(56) References Cited

U.S. PATENT DOCUMENTS

2011/0198572 A1*  8/2011  Park ..................... H01L 27/3258
                                                                257/40
2014/0159002 A1*  6/2014  Lee ..................... H01L 51/5256
                                                                257/40
(Continued)

FOREIGN PATENT DOCUMENTS

CN         107564854 A         1/2018
CN         109659444 A         4/2019

*Primary Examiner* — Didarul A Mazumder
(74) *Attorney, Agent, or Firm* — Mark M. Friedman

(57) ABSTRACT

The present disclosure provides an organic light emitting diode display panel and a method for fabricating the same to solve the technical problem where available organic light emitting diode devices of a display panel are damaged by water and oxygen intrusion. The organic light emitting diode display panel includes a substrate, a flat layer, and an anode layer. The substrate includes an active area and a frame area. The flat layer is disposed on the substrate. The flat layer includes a plurality of spaced apart spacers in the frame area, and the spacers define trenches therebetween. The anode layer is disposed on the flat layer in the active area and on bottom surfaces of the trenches and top surfaces of the spacers in the frame area. The anode layer is discontinuous in the frame area.

9 Claims, 6 Drawing Sheets

(58) Field of Classification Search
USPC .................................. 257/40; 438/82, 99
See application file for complete search history.

(56) References Cited

U.S. PATENT DOCUMENTS

| | | | | |
|---|---|---|---|---|
| 2017/0317154 A1* | 11/2017 | Heo | .................... | H01L 27/3262 |
| 2018/0097034 A1* | 4/2018 | Lee | .................... | H01L 27/3276 |
| 2020/0052051 A1* | 2/2020 | Lee | .................... | H01L 27/3246 |

* cited by examiner

ORGANIC LIGHT EMITTING DIODE DISPLAY PANEL AND METHOD FOR FABRICATING SAME

FIELD OF INVENTION

The present disclosure relates to a field of display technology, and particularly to an organic light emitting diode display panel and a method for fabricating the same.

BACKGROUND

Compared with traditional liquid crystal display devices, organic light emitting diode (OLED) display devices have advantages of lightness, thin profile, active illumination, fast response times, wide viewing angles, wide color gamut, high brightness, high contrast ratio, high resolution and low power consumption. Therefore, OLED display devices have received attention in recent years.

Each OLED display panel is mainly composed of a thin film transistor (TFT) array, an OLED device, and an encapsulation structure. The TFT array is composed of a plurality of layers such as an inorganic layer, an organic layer, and a metal layer stacked on one another. The OLED device comprises an anode layer, an organic light emitting layer, and a cathode layer. The encapsulation structure is usually a three-layer stacked structure of inorganic layer/organic layer/inorganic layer.

Due to various ways of stacking the layers, interfacial adhesion among the layers becomes an important research topic for manufacturers in the field of OLEDs. Under conditions of high temperature and high humidity, the adhesion among the layers deteriorates, resulting in peeling among the layers. Adhesion between the metal layer and the inorganic film is more easily attenuated under conditions of high temperature and high humidity.

Specifically, after a pixel defining layer is formed on the anode layer, a pattern of the pixel defining layer in the frame area (i.e. a non-display area) is used as a dam structure and does not completely cover the anode layer so that portions of the anode layer in the frame area are exposed. After encapsulation, the exposed portions of the anode layer in the frame area directly contact the bottommost inorganic layer of the encapsulation structure. Due to a difference in stress between the bottommost inorganic layer and the metal anode layer in the frame area, the interface between the two layers is prone to peeling off, especially under conditions of high temperature and high humidity. The peeling causes water and oxygen to invade the OLED device, affecting the OELD device, shortening service life of the OLED device, and causing pixels to fail to display properly.

Therefore, it is necessary to provide an organic light emitting diode display panel and a method for fabricating the same to solve the aforementioned technical problem of the prior art.

SUMMARY OF DISCLOSURE

It is an object of the present disclosure to provide an organic light emitting diode display panel and a method for fabricating the same to solve the technical problem where available OLED devices of a display panel are damaged by water and oxygen intrusion.

In order to solve the aforementioned technical problem, the present disclosure provides an organic light emitting diode display panel comprises a substrate, a flat layer, and an anode layer. The substrate comprises an active area and a frame area. The flat layer is disposed on the substrate. The flat layer comprises a plurality of spaced apart spacers in the frame area, and the spacers define trenches therebetween. The anode layer is disposed on the flat layer in the active area and on bottom surfaces of the trenches and top surfaces of the spacers in the frame area. The anode layer is discontinuous in the frame area.

In an embodiment, a cross section of each spacer is shaped as an inverted trapezoid.

In an embodiment, the organic light emitting diode display panel further comprises a pixel defining layer, a photospacer, and an encapsulation layer. The pixel defining layer is disposed on the anode layer. The pixel defining layer comprises a plurality of spaced apart dams in the frame area, and the dams is disposed above the spacers. The photospacer is disposed on one of the dams. The encapsulation layer disposed above the substrate.

In an embodiment, the encapsulation layer comprises, from bottom to top, a first inorganic layer, an organic layer, and a second inorganic layer.

The present disclosure further provides a method of fabricating an organic light emitting diode display panel comprising: providing a substrate having an active area and a frame area; forming a flat layer on the substrate, wherein the flat layer comprises a plurality of spaced apart spacers in the frame area, and the spacers define trenches therebetween; and forming an anode layer on the flat layer in the active area and on bottom surfaces of the trenches and top surfaces of the spacers in the frame area, wherein the anode layer is discontinuous in the frame area.

The present disclosure further provides an organic light emitting diode display panel comprising a substrate, a flat layer, an anode layer, a pixel defining layer, and an organic cover layer. The substrate comprises an active area and a frame area. The flat layer is disposed on the substrate. The anode layer is disposed on the flat layer. The pixel defining layer is disposed on the anode layer. The pixel defining layer comprises a plurality of spaced apart first dams in the frame area, and the first dams do not completely cover the anode layer in the frame area such that portions of the anode layer in the frame area are exposed. The organic cover layer is disposed on the exposed portions of the anode layer.

In an embodiment, the flat layer comprises a second dam in the frame area.

In an embodiment, one of the first dams is disposed above the second dam.

In an embodiment, the organic light emitting diode display panel further comprises an encapsulation layer disposed on the organic cover layer. The encapsulation layer comprises, from bottom to top, a first inorganic layer, an organic layer, and a second inorganic layer.

The present disclosure provides an organic light emitting diode display panel and a method for fabricating the same. According to the present disclosure, by making an anode layer disposed in a frame area discontinuous, peeling does not spread from the frame area to an active area, thereby extending service life of an OLED device. In addition, by disposing an organic cover layer on exposed portions of an anode layer in the frame area, peeling of interface between a first inorganic layer and the metal anode layer can be prevented, thereby protecting the OLED device from damage caused by water and oxygen intrusion.

DETAILED DESCRIPTION

Figure 1:
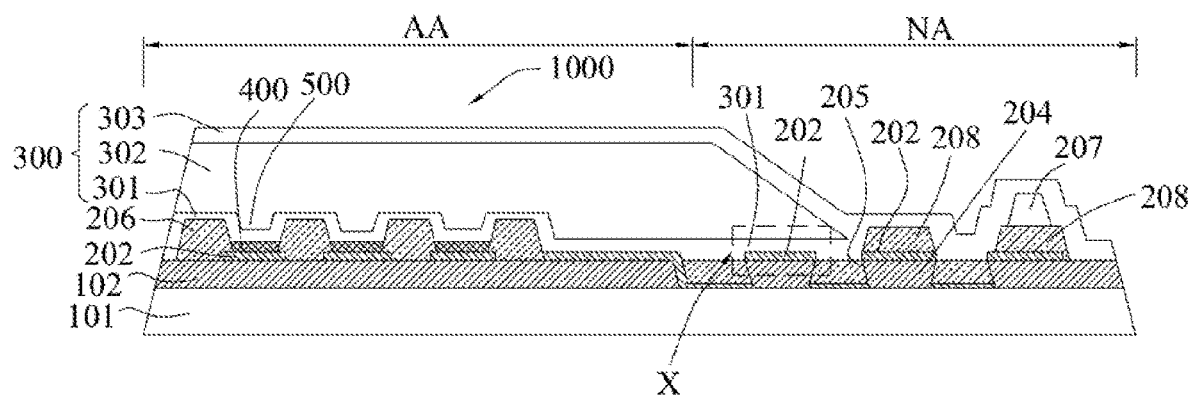
FIG. 1 is a cross-sectional side view of a first structure of an organic light emitting diode (OLED) display panel according to an embodiment of the present disclosure.

The following description of various embodiments of the present disclosure with reference to the accompanying drawings is used to illustrate specific embodiments that can be practiced. Directional terms mentioned in the present disclosure, such as "above", "below", "front", "rear", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structure are indicated by the same reference numerals.

The present disclosure provides an organic light emitting diode display panel. Please refer to FIG. 1, which is a cross-sectional side view of a first structure of an organic light emitting diode (OLED) display panel according to an embodiment of the present disclosure.

The organic light emitting diode display panel 1000 comprises a substrate 101, a flat layer 102, and an anode layer 202. The substrate 101 comprises an active area AA and a frame area NA. The flat layer 102 is disposed on the substrate 101. The flat layer 102 comprises a plurality of spaced apart spacers 204 in the frame area NA, and the spacers 204 define trenches 205 therebetween. The anode layer 202 is disposed on the flat layer 102 in the active area AA and on bottom surfaces of the trenches 205 and top surfaces of the spacers 204 in the frame area NA. The anode layer 202 is discontinuous in the frame area NA.

The active area AA is a display area, that is, an area for displaying an image. The frame area NA is a non-display area.

According to the embodiment of the present disclosure, the organic light emitting diode display panel 1000 may further comprise a pixel defining layer 206, a photospacer 207, and an encapsulation layer 300. The pixel defining layer 206 is disposed on the anode layer 202. The pixel defining layer 206 comprises a plurality of spaced apart dams 208 in the frame area NA, and the dams 208 are disposed above the spacers 204. The photospacer 207 is disposed on one of the dams 208. The encapsulation layer 300 is disposed above the substrate 101.

The encapsulation layer 300 comprises, from bottom to top, a first inorganic layer 301, an organic layer 302, and a second inorganic layer 303.

The photospacer 207 is used together with the dams 208 disposed below it as a dam structure that prevents the organic layer 302 from overflowing outward during formation of the organic layer 302 in a subsequent step. Furthermore, the photospacer 207 can ensure a certain gap between the substrate 101 and a mask during formation of an organic light emitting layer 400 in a subsequent step.

According to the embodiment of the present disclosure, a cross section of each spacer 204 is shaped as an inverted trapezoid. Therefore, during formation of the anode layer 202 on the flat layer 102, the anode layer 202 is formed in the frame area NA and on bottom surfaces of the trenches 205 and on top surfaces of the spacers 204. The anode layer 202 is not formed on side surfaces of the spacer 204. The anode layer 202 is therefore discontinuous in the frame area NA.

The anode layer 202 being discontinuous in the frame area NA has the following advantages. Even if the anode layer 202 in the frame area NA directly contacts the first inorganic layer 301 (please refer to a labeled area X of FIG. 1) and an interface between the two layers is peeling off, the peeling does not spread from the frame area NA to the active area AA. This ensures that an OLED device in the active area AA is not damaged by water and oxygen intrusion, thereby extending service life of the OLED device.

Please refer to FIG. 2A to 2G. The present disclosure further provides a method of fabricating an organic light emitting diode display panel. The method is used for fabricating the organic light emitting diode display panel 1000 of FIG. 1. The method comprises the following steps.

Figure 2A:
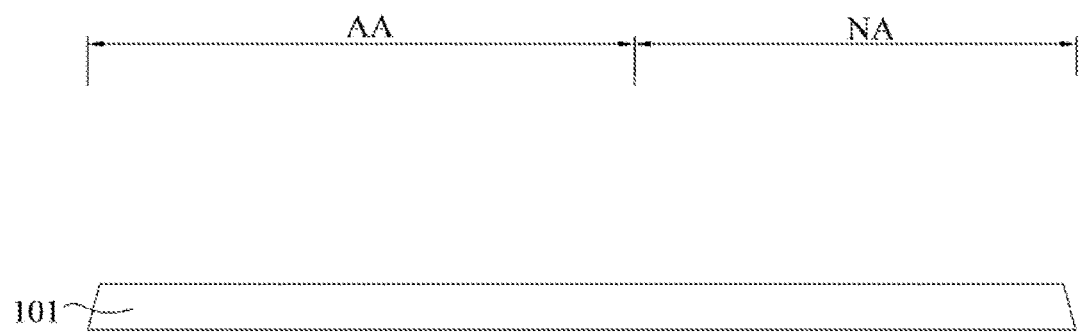
FIG. 2A to 2G are schematic flow charts showing a process for manufacturing the first structure of the organic light emitting diode display panel of FIG. 1.

First, as shown in FIG. 2A, providing a substrate 101 having an active area AA and a frame area NA.

Specifically, the active area AA is a display area, that is, an area for displaying an image. The frame area NA is a non-display area.

Figure 2B:
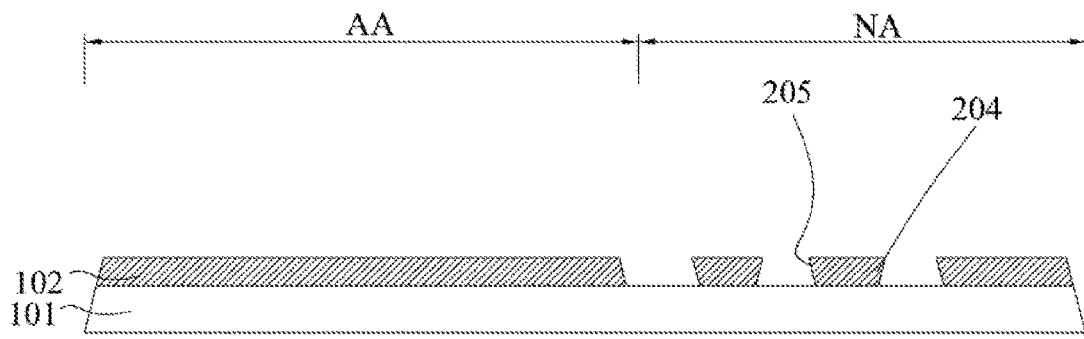

Next, as shown in FIG. 2B, forming a flat layer 102 on the substrate 101, wherein the flat layer 102 comprises a plurality of spaced apart spacers 204 in the frame area NA, and the spacers 204 define trenches 205 therebetween.

Specifically, this step comprises blanket-depositing a flat layer material on the substrate 101 first. The blanket-deposited flat layer material is then patterned using photolithography and etching processes such that the patterned flat layer material comprises a plurality of spaced apart spacers 204 in the frame area NA. As shown in FIG. 2B, a cross section of each spacer 204 is shaped as an inverted trapezoid.

In order to shape the cross section of each spacer 204 into an inverted trapezoid, a negative photoresist is adopted during the photolithography process.

Figure 2C:
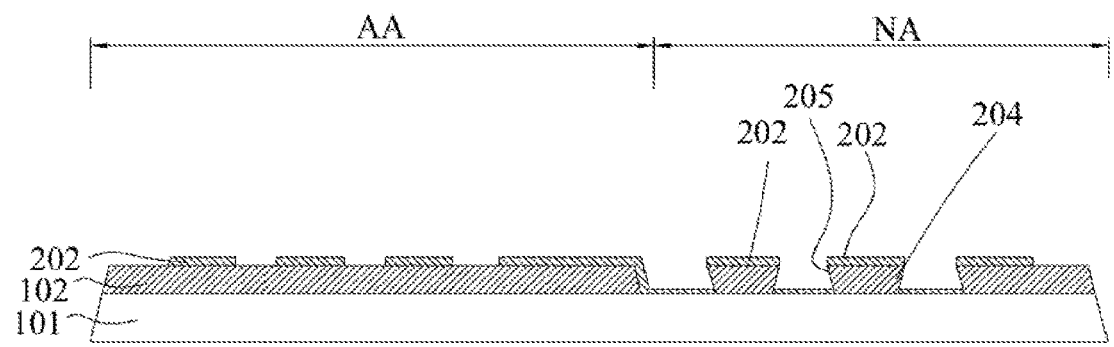

Next, as shown in FIG. 2C, forming an anode layer 202 on the flat layer 102 in the active area AA and on bottom surfaces of the trenches 205 and top surfaces of the spacers 204 in the frame area NA, wherein the anode layer 202 is discontinuous in the frame area NA.

Specifically, this step comprises blanket-depositing an anode layer material on the flat layer 102 first. The blanket-deposited anode layer material is then patterned using photolithography and etching processes.

Since the cross section of each spacer 204 is shaped as an inverted trapezoid, when blanket-depositing the anode layer material, the anode layer 202 is deposited on the bottom surfaces of the trenches 205 and the top surfaces of the spacers 204 in the frame area NA. Therefore, the anode layer 202 is discontinuous in the frame area NA.

In addition, after patterning, the patterned anode layer 202 in the active area AA has a pattern configured as an anode of an OLED device.

The anode layer 202 being discontinuous in the frame area NA has the following advantages. Even if the anode layer 202 in the frame area NA directly contacts the first inorganic layer 301 (please refer to a labeled area X of FIG. 1) and an interface between the two layers is peeling off, the peeling does not spread or extend to the active area AA. This ensures that an OLED device in the active area AA is not damaged by water and oxygen intrusion, thereby extending service life of the OLED device.

Figure 2D:
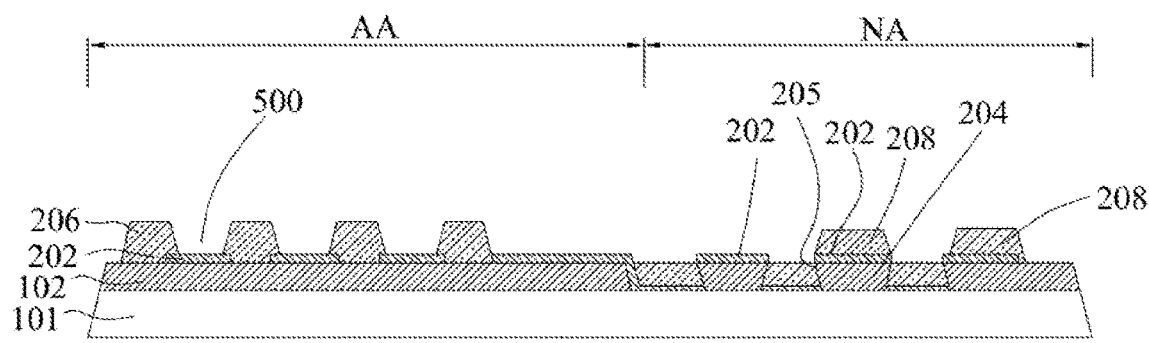

Next, as shown in FIG. 2D, forming a pixel defining layer 206 on the anode layer 202. The pixel defining layer 206 comprises a plurality of spaced apart dams 208 in the frame area NA, and the dams 208 are disposed above the spacers 204.

Specifically, this step comprises blanket-depositing a pixel defining layer material on the anode layer 202 first. The blanket-deposited pixel defining layer material is then patterned using photolithography and etching processes. When blanket-depositing the pixel defining layer material, the pixel defining layer 206 is deposited in the trenches 205 and on the spacers 204 in the frame area NA. Therefore, the pixel defining layer 206 comprises a plurality of spaced apart dams 208 in the frame area NA, and the dams 208 are disposed above the spacers 204.

In addition, after patterning, the patterned pixel defining layer 206 in the active area AA has openings 500 that define regions of red, green, and blue sub-pixels.

Figure 2E:
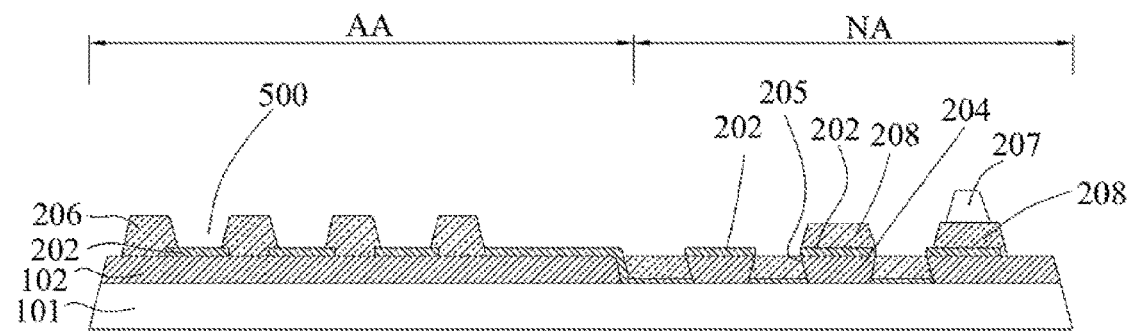

Next, as shown in FIG. 2E, forming a photospacer 207 on one of the dams 208.

Specifically, this step comprises blanket-depositing a photospacer material on one of the dams 208 first. The blanket-deposited photospacer material is then patterned using photolithography and etching processes to form the photospacer 207 on the one of the dams 208.

The photospacer 207 is used together with the dams 208 disposed below it as a dam structure that prevents the organic layer 302 from overflowing outward during formation of the organic layer 302 in a subsequent step. Furthermore, the photospacer 207 can ensure a certain gap between the substrate 101 and a mask during formation of an organic light emitting layer 400 in a subsequent step.

Figure 2F:
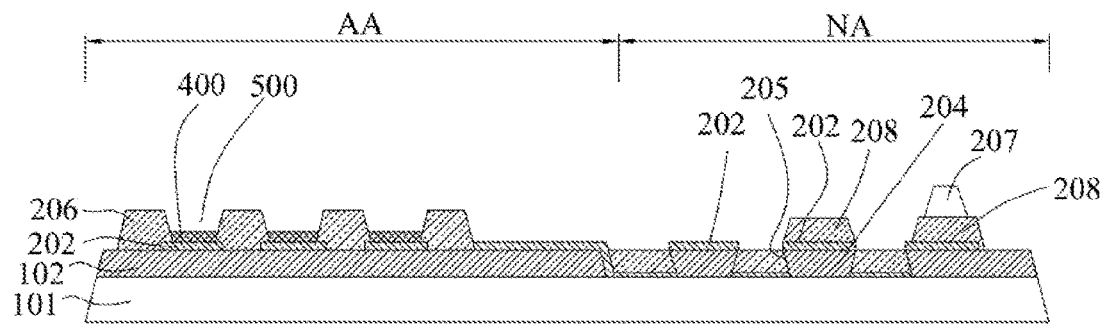

Next, as shown in FIG. 2F, forming an organic light emitting layer 400 in the openings 500.

Specifically, this step comprises printing red, green, and blue inks respectively in the openings 500 defining red, green, and blue sub-pixels using inkjet printing (IJP).

Figure 2G:
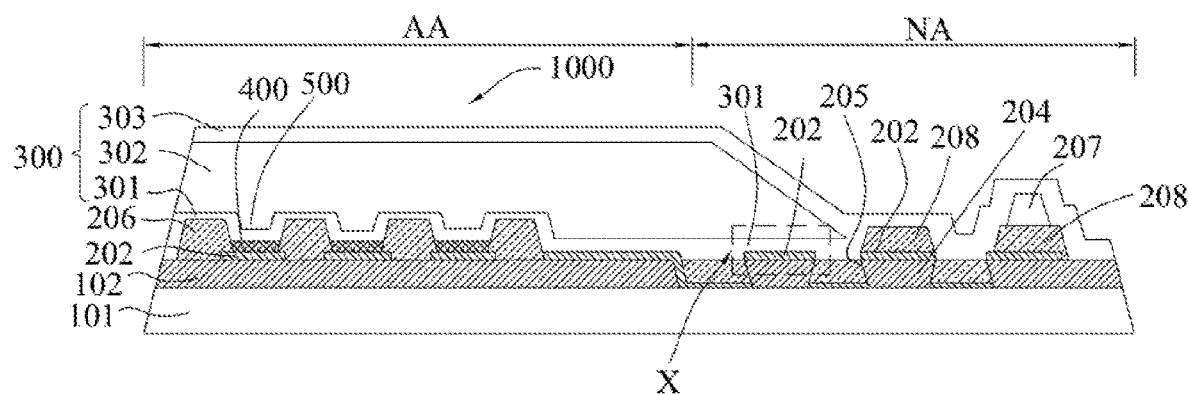

Finally, as shown in FIG. 2G, forming an encapsulation layer 300 above the substrate 101.

Specifically, this step comprises forming a first inorganic layer 301 above the substrate 101, forming an organic layer 302 on the first inorganic layer 301, and forming a second inorganic layer 303 on the organic layer 302.

That is, the encapsulation layer 300 comprises, from bottom to top, a first inorganic layer 301, an organic layer 302, and a second inorganic layer 303.

The present disclosure further provides another organic light emitting diode display panel. Please refer to FIG. 3, which is a cross-sectional side view of a second structure of an organic light emitting diode (OLED) display panel according to an embodiment of the present disclosure.

The organic light emitting diode display panel 1000 comprises a substrate 101, a flat layer 102, an anode layer 202, a pixel defining layer 606, and an organic cover layer 801. The substrate 101 comprises an active area AA and a frame area NA. The flat layer 102 is disposed on the substrate 101. The anode layer 202 is disposed on the flat layer 102. The pixel defining layer 606 is disposed on the anode layer 202. The pixel defining layer 606 comprises a plurality of spaced apart first dams 701 in the frame area NA, and the first dams 701 do not completely cover the anode layer 202 in the frame area NA such that portions of the anode layer 202 in the frame area NA are exposed. The organic cover layer 801 is disposed on the exposed portions of the anode layer 202.

According to the embodiment of the present disclosure, the flat layer 102 comprises a second dam 702 in the frame area NA, and one of the first dams 701 is disposed above the second dam 702.

According to the embodiment of the present disclosure, the organic light emitting diode display panel 1000 may further comprise an encapsulation layer 300 disposed on the organic cover layer 801. The encapsulation layer 300 comprises, from bottom to top, a first inorganic layer 301, an organic layer 302, and a second inorganic layer 303.

According to the embodiment of the present disclosure, in the frame area NA, the first inorganic layer 301 of the encapsulation layer 300 is not directly disposed on the exposed portions of the anode layer 202. The organic cover layer 801 is disposed between the first inorganic layer 301 and the exposed portions of the anode layer 202. That is, the first inorganic layer 301 directly contacts the organic cover layer 801 and the organic cover layer 801 directly contacts the exposed portions of the anode layer 202 (please refer to a labeled area Y of FIG. 3). Since the organic cover layer 801 is composed of an organic material, it can serve as a stress buffer layer to avoid peeling of an interface between the first inorganic layer 301 and the metal anode layer 202 caused by a large difference in stress between the first inorganic layer 301 and the metal anode layer 202.

Please refer to FIG. 4A to 4G. The present disclosure further provides a method of fabricating an organic light emitting diode display panel. The method is used for fabricating the organic light emitting diode display panel 1000 of FIG. 3. The method comprises the following steps.

Figure 4A:
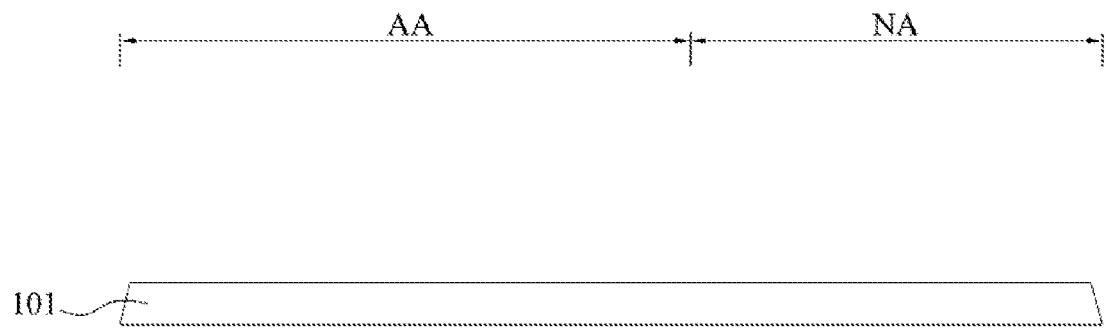
FIG. 4A to 4G are schematic flow charts showing a process for manufacturing the second structure of the organic light emitting diode display panel of FIG. 3.

First, as shown in FIG. 4A, providing a substrate 101 having an active area AA and a frame area NA.

Specifically, the active area AA is a display area, that is, an area for displaying an image. The frame area NA is a non-display area.

Figure 4B:
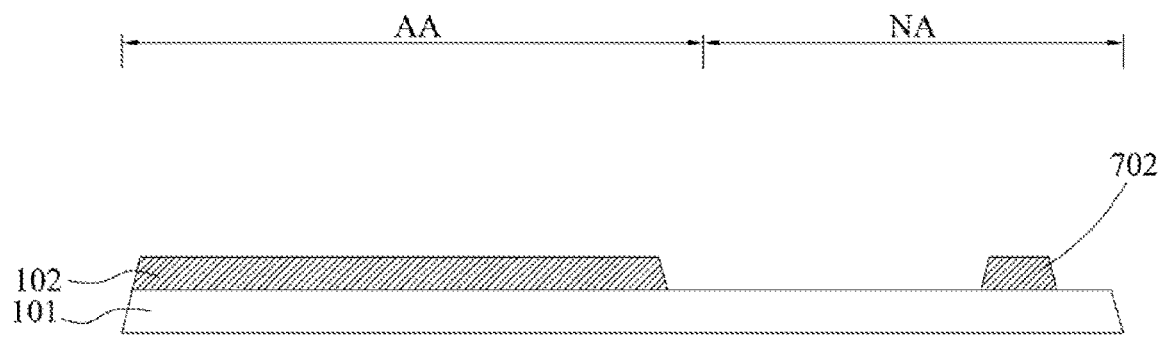

Next, as shown in FIG. 4B, forming a flat layer 102 on the substrate 101.

Specifically, this step comprises blanket-depositing a flat layer material on the substrate 101 first. The blanket-deposited flat layer material is then patterned using photolithography and etching processes such that the patterned flat layer material comprises a second dam 702 in the frame area NA.

Figure 4C:
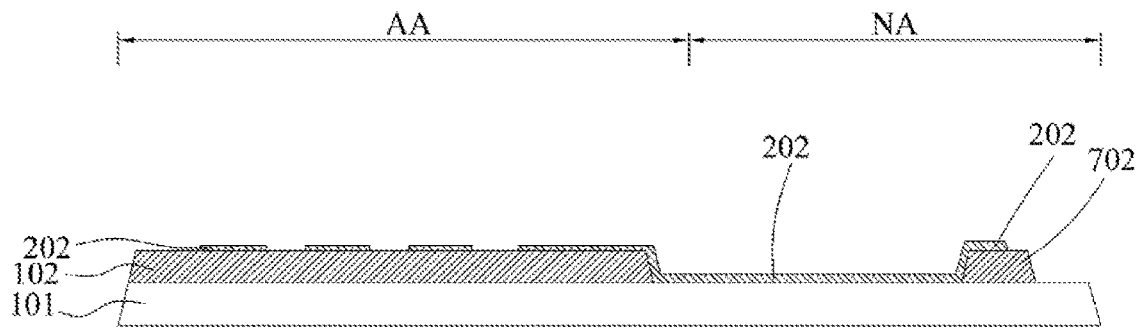

Next, as shown in FIG. 4C, forming an anode layer 202 on the flat layer 102.

Specifically, this step comprises blanket-depositing an anode layer material on the flat layer 102 first. The blanket-deposited anode layer material is then patterned using photolithography and etching processes. After patterning, the patterned anode layer 202 in the active area AA has a pattern configured as an anode of an OLED device.

Figure 3:
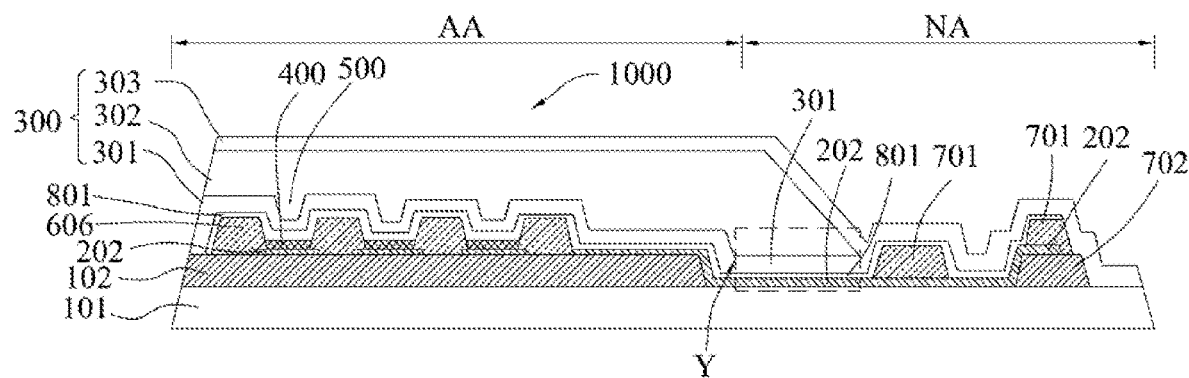
FIG. 3 is a cross-sectional side view of a second structure of an organic light emitting diode display panel according to an embodiment of the present disclosure.
Figure 4D:
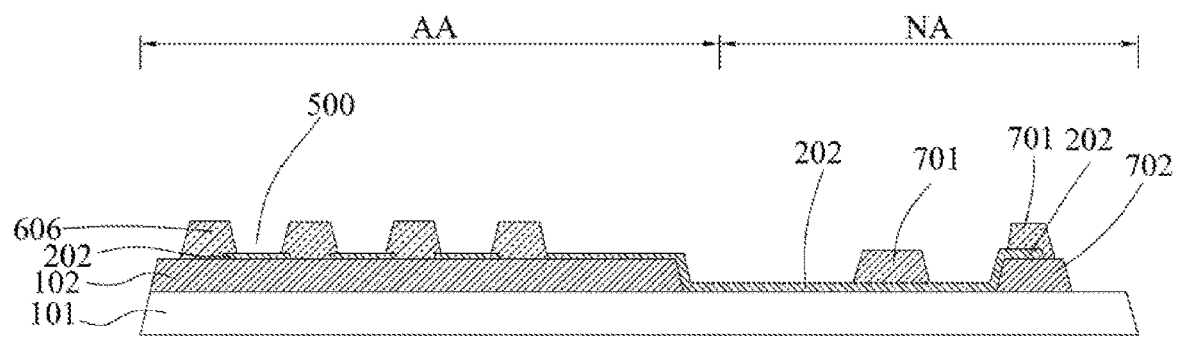

Next, as shown in FIG. 4D, forming a pixel defining layer 606 on the anode layer 202. The pixel defining layer 606 comprises a plurality of spaced apart first dams 701 in the frame area NA, and the first dams 701 do not completely cover the anode layer 202 in the frame area NA such that portions of the anode layer 202 in the frame area NA are exposed Specifically, this step comprises blanket-depositing a pixel defining layer material on the anode layer 202 first. The blanket-deposited pixel defining layer material is then patterned using photolithography and etching processes. After patterning, the patterned pixel defining layer 606 in the active area AA has openings 500 that define regions of red, green, and blue sub-pixels. The patterned pixel defining layer 606 comprises a plurality of spaced apart first dams 701 in the frame area NA. For example, as shown in FIG. 3, one of the first dams 701 is formed above the second dam 702.

The first dams 701 are used together with the second dam 702 disposed below one of them as a dam structure that prevents the organic layer 302 from overflowing outward during formation of the organic layer 302 in a subsequent step. Furthermore, the first dams 701 can ensure a certain gap between the substrate 101 and a mask during formation of an organic light emitting layer 400 in a subsequent step.

Figure 4E:
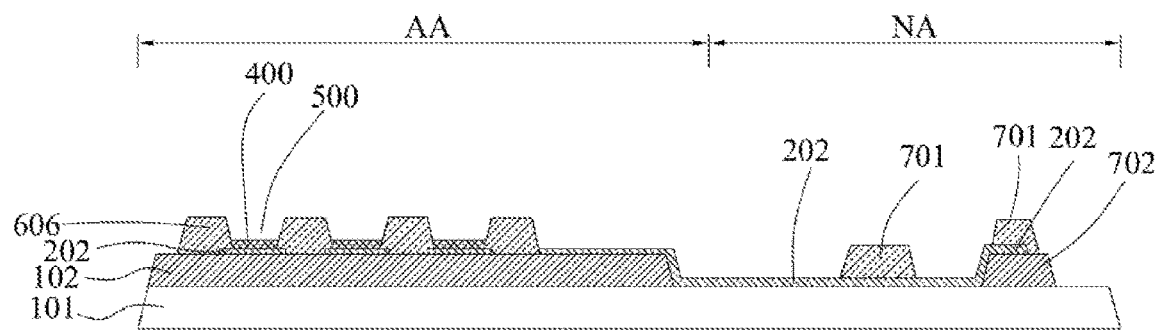

Next, as shown in FIG. 4E, forming an organic light emitting layer 400 in the openings 500.

Specifically, this step comprises printing red, green, and blue inks respectively in the openings 500 defining red, green, and blue sub-pixels using inkjet printing (IJP).

Figure 4F:
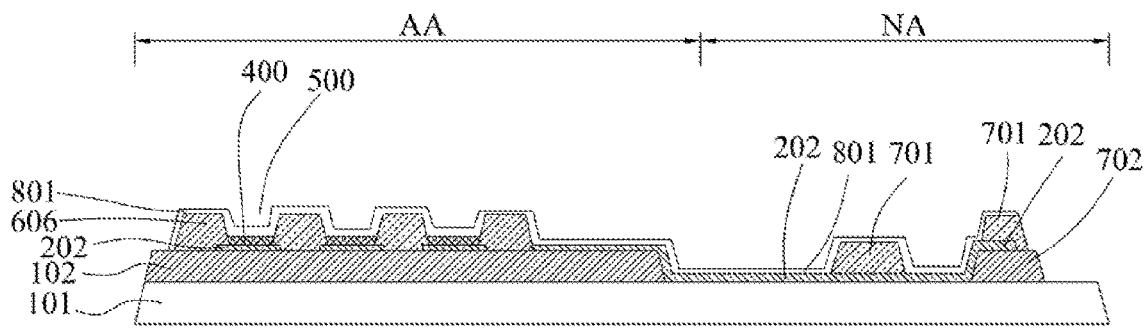

Finally, as shown in FIG. 4F, forming an organic cover layer 801 on the exposed portions of the anode layer 202.

Specifically, this step comprises blanket-depositing an organic cover layer material on the exposed portions of the anode layer 202 such that the organic cover layer 801 directly contacts the exposed portions of the anode layer 202.

Figure 4G:
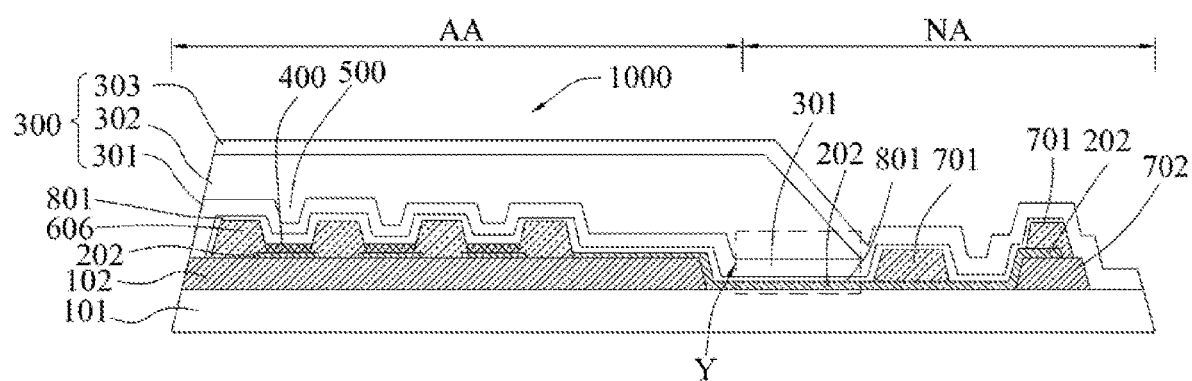

As shown in FIG. 4G, the method may further comprise forming an encapsulation layer 300 on the organic cover layer 801.

Specifically, this step comprises forming a first inorganic layer 301 on the organic cover layer 801, forming an organic layer 302 on the first inorganic layer 301, and forming a second inorganic layer 303 on the organic layer 302. That is, the encapsulation layer 300 comprises, from bottom to top, a first inorganic layer 301, an organic layer 302, and a second inorganic layer 303.

According to the embodiment of the present disclosure, in the frame area NA, the first inorganic layer 301 of the encapsulation layer 300 is not directly disposed on the exposed portions of the anode layer 202. The organic cover layer 801 is disposed between the first inorganic layer 301 and the exposed portions of the anode layer 202. That is, the first inorganic layer 301 directly contacts the organic cover layer 801 and the organic cover layer 801 directly contacts the exposed portions of the anode layer 202 (please refer to a labeled area Y of FIG. 3). Since the organic cover layer 801 is composed of an organic material, it can serve as a stress buffer layer to avoid peeling of an interface between the first inorganic layer 301 and the metal anode layer 202 caused by a large difference in stress between the first inorganic layer 301 and the metal anode layer 202.

It should be noted that the material of the organic cover layer 801 is not specifically limited in the present disclosure. As long as the material of the organic cover layer 801 can serve as a stress buffer layer, the material of the organic cover layer 801 falls within the protection scope of the present application.

In the above embodiments, the description of each embodiment has its own emphasis. For a portion that is not detailed in an embodiment, reference may be made to related descriptions of other embodiments.

The present disclosure provides an organic light emitting diode display panel and a method for fabricating the same. According to the present disclosure, by making an anode layer disposed in a frame area discontinuous, peeling does not spread from the frame area to an active area, thereby extending service life of an OLED device. In addition, by disposing an organic cover layer on exposed portions of an anode layer in the frame area, peeling of interface between a first inorganic layer and the metal anode layer can be prevented, thereby protecting the OLED device from damage caused by water and oxygen intrusion.

In the above, the present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. An organic light emitting diode display panel, comprising:
    a substrate comprising an active area and a frame area;
    a flat layer disposed on the substrate, wherein the flat layer comprises a plurality of spacers spaced apart in the frame area, a cross section of each of the plurality of spacers is shaped as an inverted trapezoid, and the plurality of spacers define trenches therebetween;
    an anode layer disposed on the flat layer in the active area, on entire bottom surfaces of the trenches, and entire top surfaces of the plurality of spacers, wherein the anode layer is free on side surfaces of the plurality of spacers and is discontinuous in the frame area; and
    a first inorganic layer disposed on the anode layer, wherein the first inorganic layer directly contacts the anode layer in the frame area.

2. The organic light emitting diode display panel according to claim 1, further comprising:
    a pixel defining layer disposed on the anode layer, wherein the pixel defining layer comprises a dam in the frame area, and the dam is disposed on the anode layer on the entire top surface of one of the plurality of spacers.

3. The organic light emitting diode display panel according to claim 2, further comprising:
    a photospacer disposed on the dam.

4. The organic light emitting diode display panel according to claim 1, further comprising:
    an organic layer disposed on a portion of the first inorganic layer; and
    a second inorganic layer covering the first inorganic layer and the organic layer;
    wherein the first inorganic layer, the organic layer, and the second inorganic layer form an encapsulation layer.

5. A method of fabricating an organic light emitting diode display panel, comprising:
    providing a substrate having an active area and a frame area;
    forming a flat layer on the substrate, wherein the flat layer comprises a plurality of spacers spaced apart in the frame area, a cross section of each of the plurality of spacers is shaped as an inverted trapezoid, and the plurality of spacers define trenches therebetween;
    forming an anode layer on the flat layer in the active area, on entire bottom surfaces of the trenches, and entire top surfaces of the plurality of spacers, wherein the anode layer is free on side surfaces of the plurality of spacers and is discontinuous in the frame area; and
    forming a first inorganic layer on the anode layer, wherein the first inorganic layer directly contacts the anode layer in the frame area.

6. An organic light emitting diode display panel, comprising:
    a substrate comprising an active area and a frame area;
    a flat layer disposed on the substrate;
    an anode layer disposed on the flat layer, wherein the anode layer is continuous in the frame area;
    a pixel defining layer disposed on the anode layer, wherein the pixel defining layer comprises a plurality of spacers spaced apart in the frame area, and portions of the anode layer in the frame area are exposed between first dams;

a continuous organic cover layer covering the anode layer and the pixel defining layer, wherein the continuous organic cover layer is directly disposed on the exposed portions of the anode layer in the frame area; and a first inorganic layer directly covering an entire portion of the continuous organic cover layer.

7. The organic light emitting diode display panel according to claim 6, wherein the flat layer comprises a second dam in the frame area.

8. The organic light emitting diode display panel according to claim 7, wherein one of the first dams is disposed above the second dam.

9. The organic light emitting diode display panel according to claim 8, further comprising:

an organic layer disposed on a portion of the first inorganic layer; and a second inorganic layer covering the first inorganic layer and the organic layer;

wherein the first inorganic layer, the organic layer, and the second inorganic layer form an encapsulation layer.

* * * * *